US010998205B2

(12) United States Patent
Miyashita et al.

(10) Patent No.: US 10,998,205 B2
(45) Date of Patent: May 4, 2021

(54) SUBSTRATE PROCESSING APPARATUS AND MANUFACTURING METHOD OF SEMICONDUCTOR DEVICE

(71) Applicant: KOKUSAI ELECTRIC CORPORATION, Tokyo (JP)

(72) Inventors: Tomoyasu Miyashita, Toyama (JP); Daigi Kamimura, Toyama (JP); Atsushi Umekawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/570,753

(22) Filed: Sep. 13, 2019

(65) Prior Publication Data
US 2020/0090965 A1    Mar. 19, 2020

(30) Foreign Application Priority Data

Sep. 14, 2018 (JP) .............................. JP2018-172788
Jun. 13, 2019 (JP) .............................. JP2019-110038

(51) Int. Cl.
*H01L 21/67* (2006.01)
*C23C 16/02* (2006.01)
(Continued)

(52) U.S. Cl.
CPC .... *H01L 21/67109* (2013.01); *C23C 16/0209* (2013.01); *H01L 21/67126* (2013.01);
(Continued)

(58) Field of Classification Search
CPC . C23C 16/0209; C23C 16/345; C23C 16/401; C23C 16/44; C23C 16/4412;
(Continued)

(56) References Cited

U.S. PATENT DOCUMENTS 3,319,887 A * 5/1967 Gallagher .......... G05D 23/1934
236/15 R
4,011,430 A * 3/1977 Witkin .................. H05B 1/023
219/486
(Continued)

FOREIGN PATENT DOCUMENTS

JP    2010-126784 A    6/2010
JP    2010126784 A *  6/2010    ............. H01L 21/31
(Continued)

*Primary Examiner* — Jeffrie R Lund
*Assistant Examiner* — Stanislav Antolin
(74) *Attorney, Agent, or Firm* — Volpe Koenig (57) ABSTRACT

A substrate processing a technology including: a substrate holder; a tubular reactor that houses the substrate holder; an inlet flange connected to the tubular reactor including a plurality of gas introduction ports; a lid that closes a lower opening of the inlet flange in a manner such that the substrate holder can be carried in and out; heater elements disposed along the outer peripheral surface of the inlet flange while avoiding the gas introduction ports; temperature sensors thermally coupled to the inlet flange or any heater element and adapted to detect temperatures; and a temperature controller that divides of the heater elements into groups and controls power supply to the respective heater elements independently for each of the groups based on temperatures detection temperatures detected by the temperature sensors.

14 Claims, 9 Drawing Sheets

(51) Int. Cl.
  *C23C 16/34*  (2006.01)
  *H01L 21/26*  (2006.01)
  *C23C 16/44*  (2006.01)
  *H01L 21/285*  (2006.01)

(52) U.S. Cl.
  CPC ........ *C23C 16/345* (2013.01); *C23C 16/4412* (2013.01); *H01L 21/26* (2013.01); *H01L 21/28556* (2013.01); *H01L 21/67248* (2013.01)

(58) Field of Classification Search
  CPC ........ C23C 16/45502; C23C 16/45525; C23C 16/45544; C23C 16/52; C30B 29/06; C30B 33/02; F27B 17/0025; H01J 2237/2001; H01J 37/32522; H01J 21/02126; H01J 21/02164; H01J 21/0217; H01J 21/02211; H01J 21/02271; H01J 21/0262; H01J 21/20; H01J 21/205; H01J 21/22; H01J 21/31; H01J 21/32051; H01J 21/67098; H01J 21/67109; H01J 21/67715; H01J 21/67126; H01J 21/6719; H01J 21/67248
  See application file for complete search history.

(56) References Cited

U.S. PATENT DOCUMENTS

| | | | | |
|---|---|---|---|---|
| 4,276,603 A | * | 6/1981 | Beck | F23N 5/203 700/209 |
| 4,430,698 A | * | 2/1984 | Harris | G05B 5/01 700/42 |
| 4,554,437 A | * | 11/1985 | Wagner | A21B 1/48 219/388 |
| 4,641,603 A | * | 2/1987 | Miyazaki | C30B 25/08 118/50 |
| 4,688,180 A | * | 8/1987 | Motomiya | F27B 9/029 432/11 |
| 4,782,445 A | * | 11/1988 | Pasquini | A21B 1/40 700/90 |
| 4,807,144 A | * | 2/1989 | Joehlin | C03B 29/08 374/E1.005 |
| 4,886,954 A | * | 12/1989 | Yu | C30B 31/12 219/390 |
| 4,937,434 A | * | 6/1990 | Nakao | G01K 1/146 118/50.1 |
| 5,099,442 A | * | 3/1992 | Furuta | G05D 23/1951 432/24 |
| 5,217,560 A | * | 6/1993 | Kurono | H01J 37/3244 118/723 R |
| 5,239,614 A | * | 8/1993 | Ueno | H01L 21/67115 392/416 |
| 5,258,601 A | * | 11/1993 | Takano | G01N 11/04 219/486 |
| 5,291,514 A | * | 3/1994 | Heitmann | F27B 9/40 219/390 |
| 5,324,540 A | * | 6/1994 | Terada | C23C 16/4412 118/500 |
| 5,368,648 A | * | 11/1994 | Sekizuka | C23C 16/4401 118/733 |
| 5,383,984 A | * | 1/1995 | Shimada | H01J 37/32522 118/723 ER |
| 5,421,892 A | * | 6/1995 | Miyagi | C23C 16/46 118/724 |
| 5,446,825 A | * | 8/1995 | Moslehi | C23C 16/481 118/724 |
| 5,484,484 A | * | 1/1996 | Yamaga | C23C 16/345 118/719 |
| 5,507,639 A | * | 4/1996 | Monoe | C23C 16/481 432/123 |
| 5,517,594 A | * | 5/1996 | Shah | C23C 16/52 118/50.1 |
| 5,533,736 A | * | 7/1996 | Yamaga | F16J 15/128 277/637 |
| 5,578,132 A | * | 11/1996 | Yamaga | C23C 16/4404 118/715 |
| 5,632,820 A | * | 5/1997 | Taniyama | C23C 16/4401 118/715 |
| 5,750,436 A | * | 5/1998 | Yamaga | C23C 16/345 438/558 |
| 5,900,177 A | * | 5/1999 | Lecouras | C30B 25/10 219/497 |
| 5,914,885 A | * | 6/1999 | Kitamura | G05D 23/1951 700/207 |
| 5,948,300 A | * | 9/1999 | Gero | C30B 25/14 118/725 |
| 5,961,323 A | * | 10/1999 | Lee | C23C 16/46 432/241 |
| 5,994,675 A | * | 11/1999 | Bethune | H01L 21/67103 118/724 |
| 5,998,767 A | * | 12/1999 | Kersch | H01L 21/67248 118/728 |
| 6,030,457 A | * | 2/2000 | Shimazu | C23C 16/4401 118/715 |
| 6,072,163 A | * | 6/2000 | Armstrong | H01L 21/67103 219/497 |
| 6,207,936 B1 | * | 3/2001 | de Waard | G05B 13/048 219/497 |
| 6,283,175 B1 | * | 9/2001 | Shimazu | C23C 16/4401 141/98 |
| 6,414,277 B1 | * | 7/2002 | Nanbu | C30B 33/00 118/724 |
| 6,492,625 B1 | * | 12/2002 | Boguslavskiy | C23C 16/46 118/725 |
| 6,606,537 B1 | * | 8/2003 | Kazmierowicz | G05D 23/1935 219/388 |
| 6,712,909 B2 | * | 3/2004 | Tometsuka | C23C 16/4401 118/725 |
| 7,674,336 B2 | | 5/2010 | Honma et al. | |
| 9,816,182 B2 | | 11/2017 | Tateno et al. | |
| 9,845,991 B2 | | 12/2017 | Kaneko | |
| 2001/0025795 A1 | * | 10/2001 | Takano | H01L 21/67253 204/491 |
| 2001/0041218 A1 | * | 11/2001 | Cook | C23C 16/4404 427/248.1 |
| 2002/0001788 A1 | * | 1/2002 | Sakamoto | H01L 21/67781 432/24 |
| 2002/0074324 A1 | * | 6/2002 | Wang | G05D 23/1917 219/494 |
| 2002/0125239 A1 | * | 9/2002 | Chen | H01L 21/67103 219/444.1 |
| 2002/0168854 A1 | * | 11/2002 | Tometsuka | C23C 16/4409 438/680 |
| 2002/0186967 A1 | * | 12/2002 | Ramanan | H01L 21/67103 392/418 |
| 2003/0010291 A1 | * | 1/2003 | Song | C23C 16/44 118/724 |
| 2003/0121905 A1 | * | 7/2003 | Nanno | G05D 23/20 219/494 |
| 2003/0213434 A1 | * | 11/2003 | Gondhalekar | C23C 16/507 118/724 |
| 2003/0213562 A1 | * | 11/2003 | Gondhalekar | C23C 16/4401 156/345.48 |
| 2004/0060519 A1 | * | 4/2004 | Beauchaine | C23C 16/4409 118/724 |
| 2004/0173599 A1 | * | 9/2004 | Velichko | H01L 21/67248 219/494 |
| 2004/0211660 A1 | * | 10/2004 | Mitrovic | H01L 21/67248 204/164 |
| 2005/0098107 A1 | * | 5/2005 | Du Bois | C23C 16/45578 118/715 |
| 2005/0247266 A1 | * | 11/2005 | Patel | C23C 16/481 118/719 |
| 2006/0021582 A1 | * | 2/2006 | Saito | H01L 21/67109 118/724 |
| 2006/0083495 A1 | * | 4/2006 | Taiquing | F27D 99/0006 392/416 |

(56) References Cited

U.S. PATENT DOCUMENTS

| | | | |
|---|---|---|---|
| 2006/0161365 A1* | 7/2006 | Tanaka | G05D 23/1935 702/99 |
| 2006/0241891 A1* | 10/2006 | Kaushal | H01L 21/67248 702/136 |
| 2007/0034158 A1* | 2/2007 | Nakaiso | C23C 16/455 118/725 |
| 2007/0056950 A1* | 3/2007 | Yudovsky | F27D 99/0006 219/406 |
| 2007/0061652 A1* | 3/2007 | Kaushal | H01L 22/10 714/733 |
| 2007/0075086 A1* | 4/2007 | Honma | C30B 31/10 220/560.13 |
| 2007/0081296 A1* | 4/2007 | Brillhart | H01L 21/6831 361/234 |
| 2007/0105392 A1* | 5/2007 | Joe | G03F 7/427 438/725 |
| 2007/0167029 A1* | 7/2007 | Kowalski | H01L 21/02238 438/769 |
| 2007/0224712 A1* | 9/2007 | Kaushal | H01L 21/67253 438/15 |
| 2007/0233427 A1* | 10/2007 | Kaushal | C23C 16/52 702/183 |
| 2007/0243317 A1* | 10/2007 | Du Bois | C23C 16/4583 427/98.9 |
| 2008/0006619 A1* | 1/2008 | Salinas | H01L 21/67248 219/446.1 |
| 2008/0083109 A1* | 4/2008 | Shibata | H01L 21/67126 29/428 |
| 2008/0090195 A1* | 4/2008 | Takahashi | F27B 17/0025 432/250 |
| 2008/0190910 A1* | 8/2008 | Shimada | H01L 21/67109 219/390 |
| 2008/0213716 A1* | 9/2008 | Koyama | H01L 21/67248 432/1 |
| 2008/0262791 A1* | 10/2008 | Terasawa | F27B 17/0025 702/176 |
| 2009/0016854 A1* | 1/2009 | Morohashi | H01L 21/67017 414/161 |
| 2009/0042404 A1* | 2/2009 | Surthi | C23C 16/45578 438/770 |
| 2009/0078197 A1* | 3/2009 | Takenaga | H01L 21/67276 118/708 |
| 2009/0084316 A1* | 4/2009 | Lee | B23Q 11/0891 118/719 |
| 2009/0254226 A1* | 10/2009 | Iwanaga | H01L 21/67248 700/300 |
| 2009/0265322 A1* | 10/2009 | Asai | G05B 19/4183 |
| 2009/0291566 A1* | 11/2009 | Ueno | H01L 21/67769 438/758 |
| 2009/0311873 A1* | 12/2009 | Wang | C23C 16/4401 438/758 |
| 2010/0024728 A1* | 2/2010 | Nakada | C23C 16/4401 118/722 |
| 2010/0051597 A1* | 3/2010 | Morita | C23C 16/4401 219/201 |
| 2010/0154711 A1* | 6/2010 | Ishibashi | C23C 16/45502 118/725 |
| 2010/0263594 A1* | 10/2010 | Na | H01L 21/67109 118/725 |
| 2010/0275848 A1* | 11/2010 | Fukuda | C30B 25/14 118/728 |
| 2010/0291763 A1* | 11/2010 | Ogawa | C23C 16/405 438/584 |
| 2011/0003482 A1* | 1/2011 | Ogawa | C23C 16/303 438/763 |
| 2011/0092072 A1* | 4/2011 | Singh | H05B 3/00 438/710 |
| 2011/0204036 A1* | 8/2011 | Murobayashi | H01L 21/67109 219/201 |
| 2011/0207339 A1* | 8/2011 | Yamazaki | H01L 21/67109 438/795 |
| 2011/0306212 A1* | 12/2011 | Sato | C23C 16/325 438/706 |
| 2012/0164847 A1* | 6/2012 | Ikeuchi | C23C 16/402 438/787 |
| 2012/0213249 A1* | 8/2012 | Kanno | G01K 1/026 374/179 |
| 2012/0292743 A1* | 11/2012 | Ohmi | F27B 17/0025 257/618 |
| 2013/0017503 A1* | 1/2013 | De Ridder | H01L 21/67109 432/18 |
| 2013/0017628 A1* | 1/2013 | Kosugi | H01L 21/67248 438/14 |
| 2013/0042803 A1* | 2/2013 | Saido | C23C 16/45578 117/88 |
| 2013/0058372 A1* | 3/2013 | Emami | H01L 21/67109 373/117 |
| 2013/0062333 A1* | 3/2013 | Emami | H01L 21/67109 219/438 |
| 2013/0065189 A1* | 3/2013 | Yoshii | C23C 16/481 432/9 |
| 2013/0068750 A1* | 3/2013 | Gaff | H01L 21/6831 219/444.1 |
| 2013/0220989 A1* | 8/2013 | Pease | H01L 21/6831 219/458.1 |
| 2014/0072925 A1* | 3/2014 | Kaneko | F27D 7/02 432/200 |
| 2014/0120487 A1* | 5/2014 | Kaneko | F27B 17/0025 432/250 |
| 2014/0120636 A1* | 5/2014 | Yamaguchi | H01L 21/67248 438/5 |
| 2014/0256160 A1* | 9/2014 | Wada | H01L 21/02238 438/786 |
| 2014/0261174 A1* | 9/2014 | Yang | H01L 21/67109 118/715 |
| 2015/0140835 A1* | 5/2015 | Tateno | C23C 16/52 438/773 |
| 2016/0002789 A1* | 1/2016 | Kontani | C23C 16/448 438/778 |
| 2016/0013053 A1* | 1/2016 | Ashihara | H01L 21/02164 438/778 |
| 2016/0076149 A1* | 3/2016 | Yamazaki | C23C 16/4401 438/758 |
| 2016/0240722 A1* | 8/2016 | Heng | B01D 53/14 |
| 2016/0245704 A1* | 8/2016 | Osaka | G01K 7/02 |
| 2016/0265107 A1* | 9/2016 | Oikawa | C23C 16/452 |
| 2017/0037512 A1* | 2/2017 | Saido | C23C 16/4408 |
| 2017/0088948 A1* | 3/2017 | Takagi | C23C 16/4401 |
| 2017/0137942 A1* | 5/2017 | Kikuchi | C23C 16/45561 |
| 2017/0335452 A1* | 11/2017 | Yamazaki | H01L 21/31 |
| 2017/0365459 A1* | 12/2017 | Ohashi | H01L 21/02222 |
| 2018/0204720 A1* | 7/2018 | Tanaka | H01L 21/31 |
| 2018/0204742 A1* | 7/2018 | Tateno | H01L 21/67017 |
| 2019/0032998 A1* | 1/2019 | Jdira | H01L 21/67109 |
| 2019/0287829 A1* | 9/2019 | Saido | H01L 21/67109 |
| 2019/0355630 A1* | 11/2019 | Yamaguchi | C23C 16/448 438/778 |
| 2020/0090965 A1* | 3/2020 | Miyashita | H01L 21/67126 |

FOREIGN PATENT DOCUMENTS

| | | | | |
|---|---|---|---|---|
| JP | 2011-003689 A | | 1/2011 | |
| JP | 2011003689 A | * | 1/2011 | C23C 16/458 |
| WO | WO-2017056244 A1 | * | 4/2017 | H01L 21/67248 |

* cited by examiner

SUBSTRATE PROCESSING APPARATUS AND MANUFACTURING METHOD OF SEMICONDUCTOR DEVICE

CROSS-REFERENCE TO RELATED PATENT APPLICATION

This application is based upon and claims the benefit of priority from Japanese Patent Application No. 2018-172788, filed on Sep. 14, 2018, and Japanese Patent Application No. 2019-110038, filed on Jun. 13, 2019, the entire contents of which are incorporated herein by reference.

BACKGROUND

Technical Field

The present disclosure relates to a substrate processing apparatus and a manufacturing method of a semiconductor device.

Related Art

Vertical substrate processing apparatuses are known universally as substrate processing tools that perform substrate processing in a manufacturing process of semiconductor devices. In the vertical substrate processing apparatus, a plurality of substrates is charged into a process chamber and collectively processed in a state in which the plurality of substrates is stacked and held in multiple stages.

In a case of executing a high-temperature process using a source gas that is hardly decomposed, a temperature at a furnace throat in a lower portion of a process chamber also becomes high, and therefore, there is a possibility that the temperature exceeds a heat resistance temperature of a seal member such as an O-ring provided at the furnace throat. For this reason, there is a case where a temperature of the seal member is kept within a heat resistance temperature range by providing a cooling water channel in the furnace throat and making cooling water flow inside the cooling water channel.

On the other hand, in a case where the temperature of the furnace throat is lowered, a reaction by-product of a gas adheres to the furnace throat and causes generation of particles. Therefore, conventionally, a heater is provided in an entire periphery of the furnace throat as a means to suppress such adhesion of the reaction by-product to the furnace throat so as to prevent the temperature of the furnace throat from being excessively lowered (see JP 2010-126784 A, for example).

SUMMARY

A furnace throat is provided with a gas exhaust port to receive heat of an exhaust gas. Therefore, even when an entire periphery of the furnace throat is uniformly heated, a temperature in the vicinity of the exhaust port becomes high, and temperature unevenness is caused between the exhaust port side and an opposite side of the exhaust port. Specifically, in a case of controlling the heater by detecting the temperature in the vicinity of the exhaust port, when the temperature on the opposite side of the exhaust port becomes excessively low and the heater is controlled by detecting such a temperature in the vicinity of the opposite side of the exhaust port, the temperature on the exhaust port side becomes excessively high, and damage to parts such as damage to the heater occurs with a high possibility.

Additionally, when the temperature unevenness is caused between the exhaust port side of the furnace throat and the opposite side of the exhaust port, a place not locally heated and having a low temperature is generated and a by-product adheres thereto.

According to one aspect of the present disclosure, provided is a technology including:

a substrate holder that holds a plurality of substrates arrayed at predetermined intervals;

a tubular reactor that has a cylindrical shape extending in a vertical direction, the tubular reactor including a ceiling that closes an upper end and an opening portion that is opened at a lower end, and housing the substrate holder in a manner such that the substrate holder can be carried in and out through the opening portion;

a cylindrical inlet flange connected to the lower end of the tubular reactor and including a plurality of gas introduction ports on an outer peripheral surface;

a lid that closes a lower end opening of the inlet flange in a manner such that the substrate holder can be carried in and out;

temperature sensors thermally coupled to the inlet flange or heater elements and adapted to detect temperatures;

heater elements disposed along the inlet flange while avoiding the gas introduction ports, a number of the heater elements is greater than N that is a number of the temperature sensors; and a temperature controller that divides the heater elements into groups of N and controls power supply to the respective groups of heater elements independently based on detection temperatures detected by the temperature sensors.

DETAILED DESCRIPTION

A detailed description will hereinafter be given of an embodiment of the present disclosure with consultation of FIGS. 1 to 8. A substrate processing apparatus 1 is formed as an example of a device used in a manufacturing process for a semiconductor device.

Figure 1:
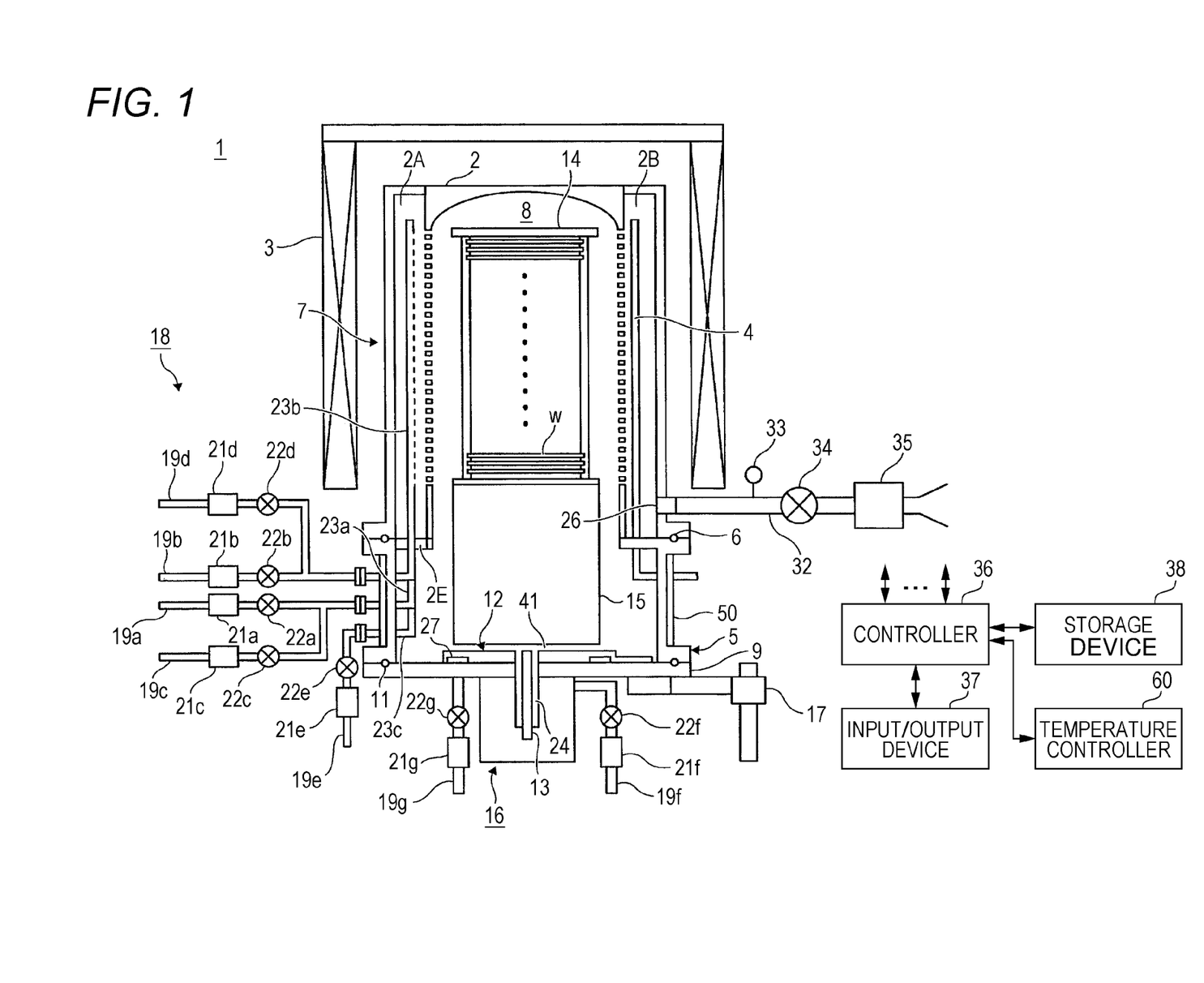
FIG. 1 is a longitudinal cross-sectional view showing an outline of a vertical processing furnace of a substrate processing apparatus.

The substrate processing apparatus 1 includes: a tubular reactor 2 including a ceiling that closes an upper end and having a cylindrical shape extending in a vertical direction;

and a heater (electric furnace) 3 as a heating means installed at an outer periphery of the tubular reactor 2. The tubular reactor 2 is formed from, for example, quartz (SiO) or silicon carbide (SiC). A temperature detector 4 is erected along an inner wall of the tubular reactor 2.

An inlet flange (manifold) 5, (which will be described later) is connected, to a lower end opening portion of the tubular reactor 2 via a seal member 6 such as an O-ring, and supports a lower end of the tubular reactor 2. The inlet flange 5 is formed from, for example, a metal such as stainless steel. The tubular reactor 2 and the inlet flange 5 constitute a processing chamber 7. Inside the processing chamber 7, a process chamber 8 that processes a wafer W as a substrate is formed.

Additionally, in the tubular reactor 2, a supply buffer chamber 2A and an exhaust buffer chamber 2B are formed facing each other in a manner projecting in an outer peripheral direction (radial direction). The supply buffer chamber 2A is partitioned into a plurality of spaces by partition walls extending vertically. In the respective partitions of the supply buffer chamber 2A, a nozzle 23a, a nozzle 23b, and a nozzle 23c (described later) are respectively installed. A boundary wall between the process chamber 8 and each of the supply buffer chamber 2A and the exhaust buffer chamber 2B is formed to have an inner diameter same as an inner diameter of the tubular reactor 2 in a place where the supply buffer chamber 2A and the like are not provided. With this structure, a circumference of a wafer W is surrounded by a wall concentric with the wafer W. The boundary wall is provided with a plurality of slits that establishes communication between both sides thereof. Below the supply buffer chamber 2A, an opening portion 2E used to insert and remove the nozzle 23a, the nozzle 23b, and the nozzle 23c is formed. The opening portion 2E is formed to have a width substantially the same as a width of the supply buffer chamber 2A. Note that it is difficult to eliminate a gap between the opening portion 2E and each of bases of the nozzle 23a, the nozzle 23b, and the nozzle 23c, no matter what kind of shape the opening portion 2E has. Therefore, a gas may flow inside and outside the supply buffer chamber 2A via the gap.

The process chamber 8 houses, inside thereof, a boat 14 provided as a substrate holder that vertically holds multiple, for example, 25 to 150 wafers W arrayed at predetermined interval like shelves. The boat 14 is formed from, for example, quartz, SiC or the like, and the boat 14 is supported above a heat insulation structure 15. The boat 14 and the heat insulation structure 15 constitute the substrate holder.

An outer shape of the heat insulation structure is columnar and is supported by a rotation shaft 13 penetrating a lid 9. The rotation shaft 13 is connected to a rotation mechanism 16 installed below the lid 9. For example, a magnetic fluid seal is provided at a portion of the rotation shaft 13 penetrating the lid 9, and the rotation shaft 13 is rotatable in a state of hermetically sealing the inside of the tubular reactor 2. When the rotation shaft 13 is rotated, the heat insulation structure 15 and the boat 14 are integrally rotated. The lid 9 is driven in a vertical direction by a boat elevator 17 provided as an elevating machine. The substrate holder and the lid 9 are integrally moved up and down by the boat elevator 17, and the boat 14 is loaded/unloaded via an opening portion of the tubular reactor 2. In other words, the tubular reactor 2 houses the boat 14 in a manner such that the boat 14 can be carried in and out via the opening portion, and the lid 9 seals a lower end opening of the inlet flange 5 in a manner such that the boat 14 can be carried in and out.

The substrate processing apparatus 1 includes a gas supply mechanism 18 that supplies the process chamber 8 with a source gas, a reaction gas, or an inert gas as a processing gas used in substrate processing. The processing gas supplied by the gas supply mechanism 18 is selected in accordance with a kind of a film to be deposited. In the present embodiment, the gas supply mechanism 18 includes a source gas supplier, a reaction gas supplier, an inert gas supplier, a first purge gas supplier, and a second purge gas supplier.

The source gas supplier includes a gas supply pipe 19a. The gas supply pipe 19a is provided with, in the order from an upstream direction, a mass flow controller (MFC) 21a that is a flow rate control device (flow rate controller) and a valve 22a that is an on-off valve. A downstream end of the gas supply pipe 19a is connected to the nozzle 23a penetrating a side wall of the inlet flange 5. The nozzle 23a is vertically erected inside the tubular reactor 2 along the inner wall of the tubular reactor 2, and formed with a plurality of supply holes opened toward the wafers W held by the boat 14. The source gas is supplied to the wafers W through the supply holes of the nozzle 23a.

In the following, the reaction gas is supplied to the wafers W from the reaction gas supplier via a gas supply pipe 19b, an MFC 21b, a valve 22b, and the nozzle 23b in a similar structure. The inert gas is supplied to the wafers W from the inert gas supplier through gas supply pipes 19c, 19d, 19e, MFCs 21c, 21d, 21e, valves 22c, 22d, 22e, and the nozzles 23a, 23b, 23c.

The first purge gas supplier includes a gas supply pipe 19f. The gas supply pipe 19f is provided with an MFC 21f and a valve 22f in the order from an upstream direction. A downstream end of the gas supply pipe 19f is connected to a hollow portion 24 formed around the rotation shaft 13. The hollow portion 24 is sealed by a magnetic fluid seal before a bearing and is opened at an upper end, that is, opened to the inside of the tubular reactor 2. Additionally, a space communicating from the hollow portion 24 to an upper surface of a protection plate 12 is formed, and the space is continuous to a gap 46 formed between the heat insulation structure 15 and the protection plate 12 to form a first purge gas flow path. Thus, a first purge gas 28 supplied from the first purge gas supplier is supplied to below the processing chamber 7 that is a furnace throat while purging the gap 46. In other words, the first purge gas 28 purges a circumference of the rotation shaft 13 on an upstream side, and purges the vicinity of the nozzles 23a to 23c at the furnace throat on a downstream side, and then finally is exhausted from an exhaust port 26 formed at the lower end of the tubular reactor 2. Note that the purge gas may be any gas that does not react with the source gas or the reaction gas.

The second purge gas supplier includes a gas supply pipe 19g. The gas supply pipe 19g is provided with an MFC 21g and a valve 22g in the order from an upstream direction. A downstream end of the gas supply pipe 19g penetrates the lid 9, and a second purge gas supply port is formed on an upper surface of the lid 9. Therefore, the second purge gas supply port is formed on the upper surface of the lid 9 and opened to a second purge gas flow path 27. An opened position of the second purge gas supply port is in the vicinity of the nozzles 23a, 23b, and 23c. A flexible pipe like a bellows pipe is used as the gas supply pipe 19a between the valve 22g and the second purge gas supply port. The second purge gas flow path 27 has an annular shape or a substantially annular (loop-like) shape, and is concentrically formed on a lower surface of the protection plate 12. A second purge gas 49 supplied into the second purge gas flow path 27 flows inside the second purge gas flow path 27 formed around an entire periphery. At this time, a gap 46 is formed between the protection plate 12 and the lid 9 on an outer peripheral side of the second purge gas flow path 27 (see FIG. 2). Therefore, the second purge gas 49 horizontally flows out from the gap 46 while purging the upper surface of the lid 9 in a process of flowing in the second purge gas flow path 27.

An exhaust pipe 32 is attached to the exhaust port 26 formed on an outer wall of the exhaust buffer chamber 2B. A vacuum pump 35 provided as a vacuum exhaust device is connected to the exhaust pipe 32 via a pressure sensor 33 as a pressure detection device (pressure detector) that detects a pressure inside the process chamber 8 and an auto pressure controller (APC) valve 34 as a pressure adjustment device (pressure adjuster). With this structure, the pressure inside the process chamber 8 can be set to a processing pressure in accordance with processing. The exhaust pipe 32 is installed at a position facing the nozzles 23a, 23b and 23c.

A controller 36 is connected to the rotation mechanism 16, the boat elevator 17, the MFCs 21a to 21g and the valves 22a to 22g of the gas supply mechanism 18, and the APC valve 34 to control these constituent elements. The controller 36 includes a microprocessor (computer) including a CPU, for example, and controls operation of the substrate processing apparatus 1. An input/output device formed as, for example, a touch panel or the like is connected to the controller 36.

A storage device 38 provided as a storage medium is connected to the controller 36. The storage device 38 stores, in a readable manner, a control program to control the operation of the substrate processing apparatus 1 and a program (also referred to as a recipe) to cause each of the constituent elements of the substrate processing apparatus 1 to execute processing in accordance with processing conditions.

The storage device 38 may be a storage device (a hard disk or a flash memory) incorporated inside the controller 36, or may be a portable external recording device (a magnetic tape, a magnetic disk such as a flexible disk or a hard disk, an optical disc such as a CD or a DVD, a magneto-optical disk such as an MO, or a semiconductor memory such as a USB memory or a memory card). Additionally, a program may be provided to the computer by using a communication means such as the Internet or a dedicated line. The program is read from the storage device 38 in accordance with a command from the input/output device 37 or the like as necessary, and the controller 36 executes processing in accordance with the read recipe, thereby causing the substrate processing apparatus 1 to execute desired processing under the control of the controller 36.

Furthermore, the controller 36 is connected to a temperature controller 60 that controls a heater 50 as a heating means (heating mechanism) installed on an outer peripheral surface of the inlet flange 5. The temperature controller 60 has a target temperature and a compensation value (described later) set by the controller 36 in accordance with the recipe. For example, a temperature at which a by-product may be prevented from adhering to the inlet flange 5 is set while, at least, the process chamber 8 is supplied or filled with a gas that may generate the by-product to be a problem during a series of substrate processing.

Next, a structure of the inlet flange 5 and a peripheral portion thereof will be described based on FIGS. 2 to 6.

Figure 2:
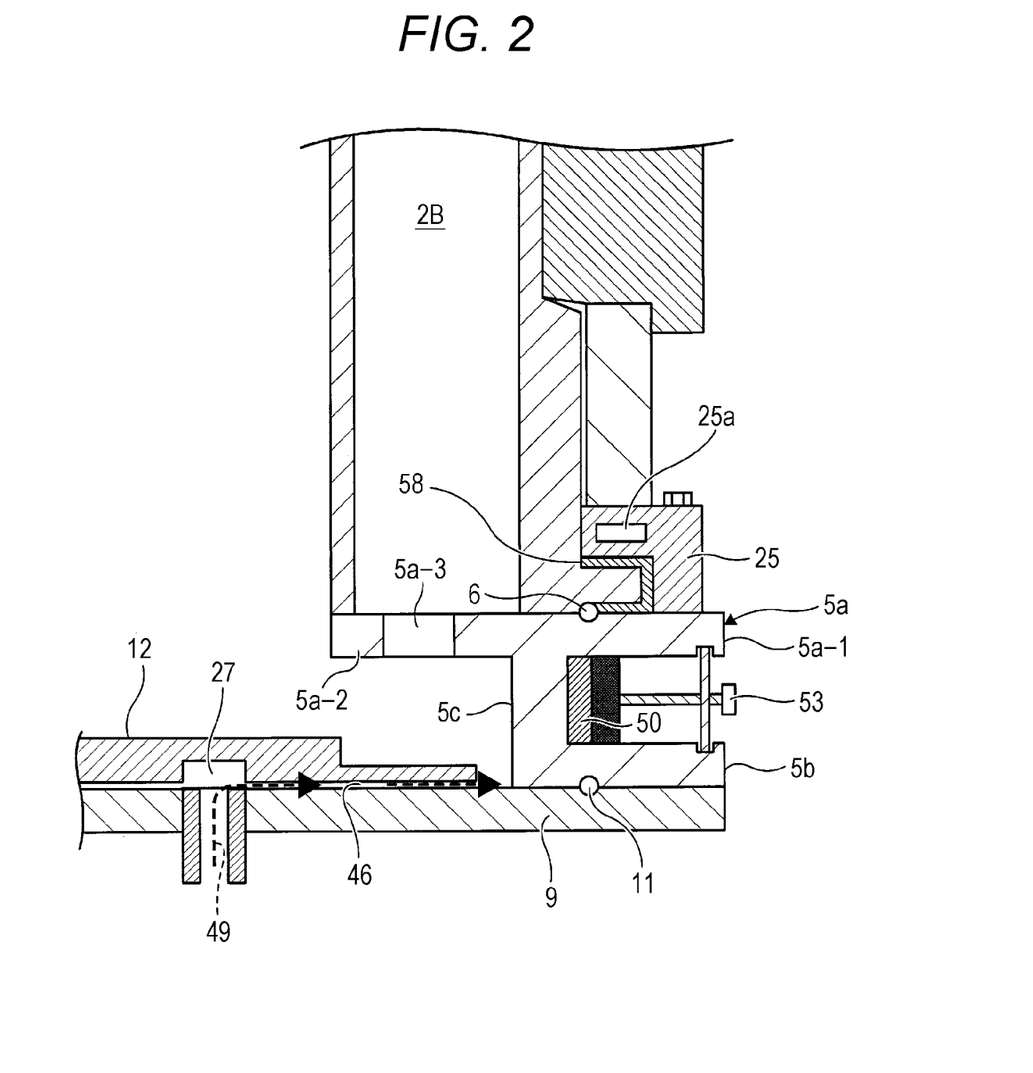
FIG. 2 is a longitudinal cross-sectional view showing a periphery of an inlet flange.

The inlet flange 5 is formed in a cylinder shape and connected to the lower end of the tubular reactor 2. Additionally, an opening that is the lower end opening of the inlet flange 5 and also is the opening on an opposite side of a side of the inlet flange 5 connected to the tubular reactor 2 is closed by the lid 9 in a manner such that the boat 14 can be carried in and out.

Furthermore, the inlet flange 5 includes: an upper flange 5a hermetically connected to the tubular reactor 2 at an upper end thereof; a lower flange 5b hermetically connected to the lid 9 at the lower end thereof; and a cylindrical portion 5c that connects the upper flange 5a and the lower flange 5b.

The upper flange 5a includes: an outer flange 5a-1 projecting in an outer peripheral direction; and an inner flange 5a-2 projecting in an inner peripheral direction. The outer flange 5a-1 supports the tubular reactor 2 (including the outer walls of the supply buffer chamber 2A and the exhaust buffer chamber 2B) provided as outer tubes. The inner flange 5a-2 supports inner walls of the supply buffer chamber 2A and the exhaust buffer chamber 2B provided as (portions of) inner tubes. The inner flange 5a-2 is formed with a hole 5a-3 communicating with the exhaust buffer chamber 2B. The inner flange 5a-2 may be welded to the inlet flange 5 in order to enhance heat transfer described later. Additionally, the seal member 6 such as an O-ring is installed on an upper surface of the outer flange 5a-1, and the seal member 6 hermetically seals the tubular reactor 2 from external air.

The lower end opening portion of the inlet flange 5 (the lower end opening portion of the processing chamber 7) is opened/closed by the lid 9 having a disc shape. A seal member 11 such as an O-ring is installed on the upper surface of the lid 9, and the seal member 11 hermetically seals the tubular reactor 2 from the external air.

A metal clamp 25 that presses a lower end flange (lip) of the tubular reactor 2 against the upper flange 5a is fixed to the upper flange 5a with a bolt. The clamp 25 can be realized by pieces which constitute a circular ring as a whole. A thin elastic member 58 made from a heat-resistant resin may be provided as a cushion between the upper flange 5a and the clamp 25. Inside the clamp 25, a cooling water channel 25a embedded piecewise in an entire periphery is formed. The cooling water channel 25a cools the opening portion of the tubular reactor 2, thereby suppressing a temperature rise of the seal member 6 and keeps the temperature of the seal member 6 within a heat resistant temperature. The clamp 25 actually includes two to three arc-shaped members, and the cooling water channel 25a may be connected after the installation. Note that the cooling water channel 25a may also be provided inside the outer flange 5a-1.

Figure 3:
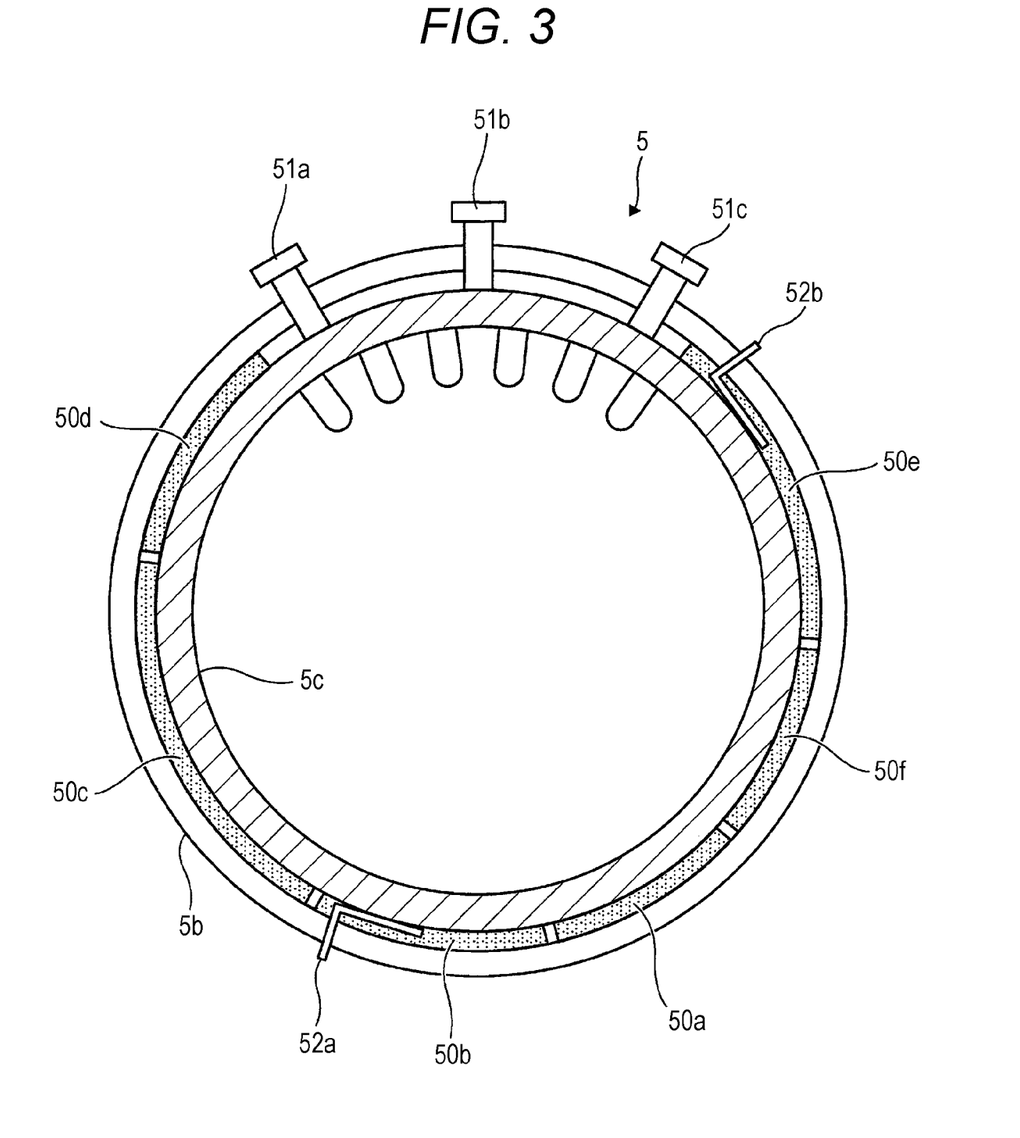
FIG. 3 is a transverse cross-sectional view of a cylindrical portion of the inlet flange.

Furthermore, as shown in FIG. 3, three gas introduction ports 51a, 51b, and 51c are provided on the outer peripheral surface of the inlet flange 5, that is, an outer peripheral surface of the cylindrical portion 5c. A height of the cylindrical portion 5c can be set to be substantially equal to or shorter than a maximum diameter of connectors included in the gas introduction ports 51a, 51b, and 51c. In other words, the inlet flange 5 is thinned to nearly a limit of manufacturability and assemblability such as 25 to 38 mm. Gas supply pipes 19a, 19b and 19e are attached to the gas introduction ports 51a, 51b and 51c, respectively. Additionally, the nozzles 23a, 23b, and 23c are attached to the gas introduction ports 51a, 51b, and 51c respectively on an inner peripheral surface side of the inlet flange 5. On both sides of each of the nozzles 23, bracket members to support each of the nozzles are provided in a manner projecting from the inner peripheral surface of the inlet flange to a center thereof.

Figure 4:
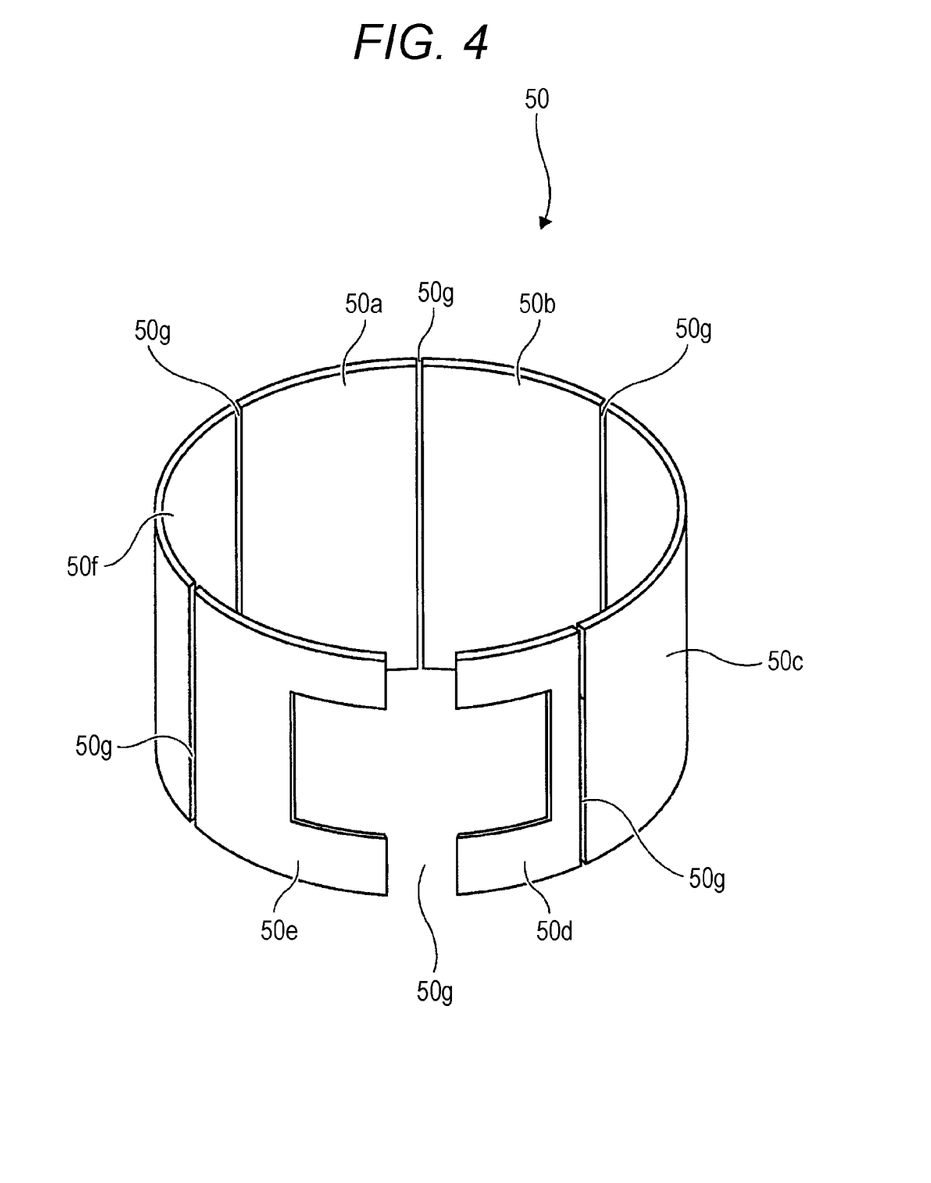
FIG. 4 is a perspective view showing heater elements that heat the inlet flange.

Furthermore, the heater 50 that electrically heats the inlet flange 5 from the out side is provided around the inlet flange 5, more precisely, the outer peripheral surface of the cylindrical portion 5c. The heater 50 is pressed against the outer peripheral surface of the inlet flange 5 by struts (tension rods) 53. FIG. 4 illustrates a state in which heater elements 50a to 50f constituting the heater 50 are detached from the inlet flange 5.

The heater 50 is formed in a substantially cylindrical shape as a whole, and is disposed while avoiding the gas introduction ports 51a to 51c. The heater includes six heater elements 50a, 50b, 50c, 50d, 50e, and 50f, and a cross section of each of the heater elements 50a to 50f is formed in an arc shape. In other words, the respective heater elements 50a to 50f are disposed along the outer peripheral surface of the inlet flange 5 by dividing the entire periphery of the inlet flange into a plurality of portions while avoiding the gas introduction ports 51a, 51b, 51c, and the like such as piping components. Each of the heater elements may be pressed by using two to three struts 53 via an adiabatic pressure plate. Note that, in the present embodiment, the gas introduction ports 51a to 51c are arranged between the heater element 50d and the heater element 50e. Additionally, void spaces 50g are provided between the respective heater elements 50a, 50b, 50c, 50d, 50e, and 50f.

As each of the heater elements 50a to 50f, for example, a flexible heater having a structure in which a resistance wire is sandwiched between two polyimide insulating plates or a heater in which a rod-like cartridge heater is embedded in an arc-shaped metal block is used. All or part of such heat radiators could be directly implanted into the cylindrical portion 5c. Note that a jacket heater, a ribbon heater, or the like (not shown) and a temperature sensor for adjusting a temperature of such a heater may be provided separately in the vicinity of the gas introduction ports 51a to 51c. The heater elements can be considered as elements to compensate heat dissipation from the outer peripheral surface of the inlet flange 5, and normally, the inner peripheral surface of the inlet flange 5 that receives heat from the heater 3 has a higher temperature. An upper limit of a normal temperature of a flexible heater is about 280° C., and this is sufficient to keep the inner peripheral surface higher than a lower limit temperature at which by-product adhesion occurs (300 to 350° C.)

Additionally, a temperature sensor 52a is provided on the outer peripheral surface of the inlet flange 5 in a periphery of the heater element 50b located on the exhaust port side where the exhaust pipe 32 is arranged above. The temperature sensor 52a is provided in a manner contacting the outer peripheral surface of the inlet flange 5 in the vicinity of the heater element 50b provided below the exhaust port. Furthermore, a temperature sensor 52b is provided on the outer peripheral surface of the inlet flange 5 in a periphery of the heater element 50e located on the side of the gas introduction port 51a to 51c. The temperature sensor 52b detects a temperature in the periphery of the heater element 50e, that is, in the periphery of the gas introduction ports 51a to 51c.

Note that the temperature sensor 52a and the temperature sensor 52b are to be thermally coupled respectively to the inlet flange 5 or any one of the heater elements excluding the heater element 50b at places other than the vicinity below the exhaust port.

Figure 5A:
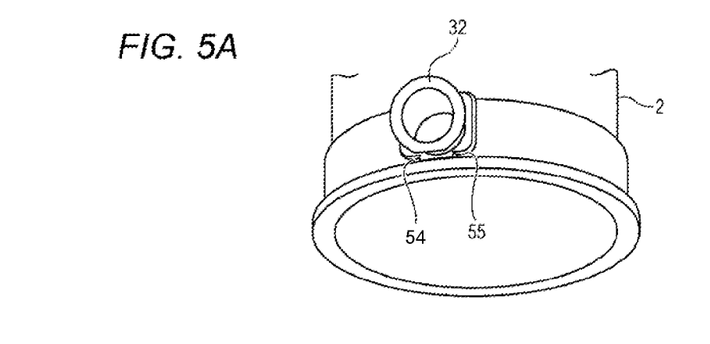
FIG. 5A and FIG. 5B are perspective views showing a periphery of an exhaust pipe of a tubular reactor.
Figure 5B:
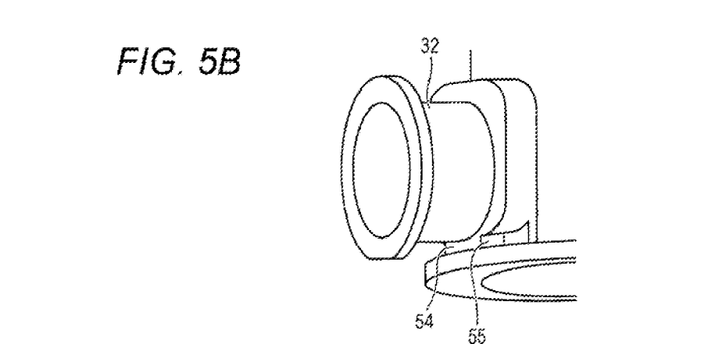
Figure 5C:
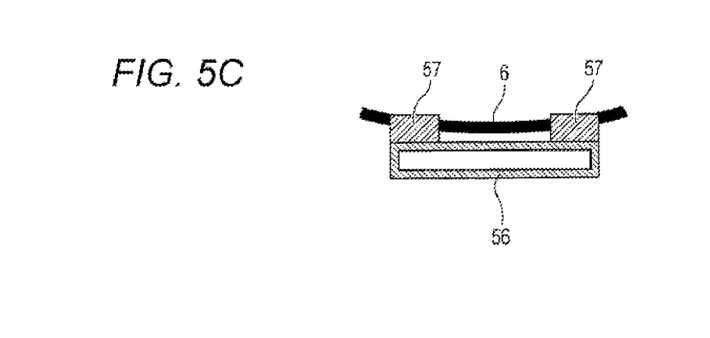
FIG. 5C is a diagram to describe a peripheral structure of a seal member arranged at a lower portion of the exhaust pipe.

FIGS. 5A to 5C are schematic views showing a structure in a periphery of the exhaust pipe 32.

In a root of the exhaust port 26 of the exhaust pipe 32, an overlaid portion 54 is formed to facilitate connection to the tubular reactor 2 and enhance strength. To connect the exhaust pipe 32 to the tubular reactor 2 at a position having a temperature as low as possible, a lower end of the overlaid portion 54 is located closer to a lower end to an extent connected to the lower end flange of the tubular reactor 2. Therefore, a structure different from the structure shown in FIG. 2 may be used. In the present example, a dedicated cooling block 56 is provided in the vicinity of the exhaust port 26. In both ends of the overlaid portion 54 immediately below the exhaust pipe 32, a cut-away portion 55 having substantially no strength problem is provided so as to be separated from the lower end flange. Additionally, a tongue portion 57 made from a metal such as stainless steel has a shape that partly enters the cut-away portion 55 and extends from the cooling block 56 where the cooling water can circulate. The tongue portion 57 suppresses heat transfer from the exhaust pipe 32 to the seal member 6. Note that an elastic member may be provided between the cut-away portion 55 and the tongue portion 57 as well. The elastic member may enhance heat transfer.

In other words, in the present embodiment, a cooler such as the cooling block 56 or the tongue portion 57 provided adjacent to a lower side of the exhaust pipe 32 or the above-described cooling water channel 25a are provided, and therefore, it is possible to efficiently suppress temperature increase caused by the heating by the heater 3 or heat transfer from the exhaust gas in the seal member 6 at the lower portion of the exhaust port of the tubular reactor 2.

Figure 6:
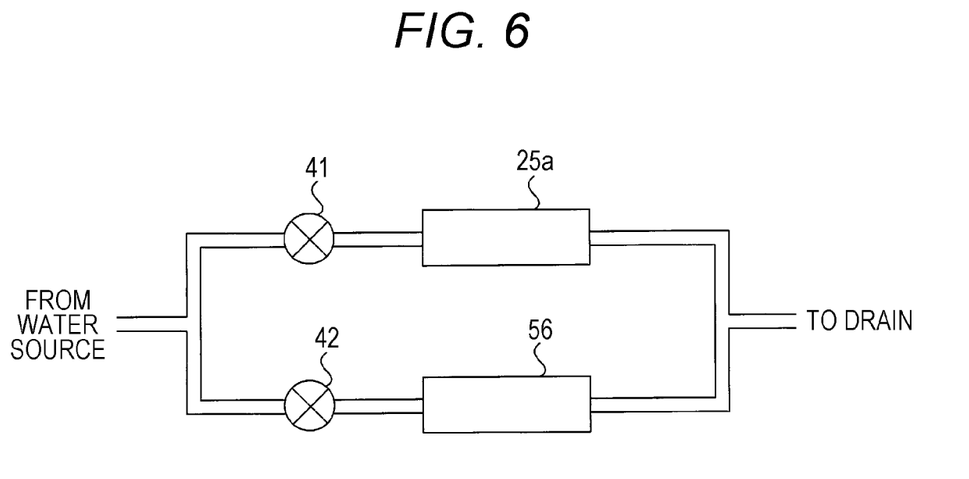
FIG. 6 is a diagram showing a cooling water supply system to a furnace throat of the substrate processing apparatus.

As shown in FIG. 6, the substrate processing apparatus 1 includes, as an auxiliary facility, a supply system that supplies the cooling water to the coolers such as the cooling water channel 25a and the cooling block 56. The supply system is connected to, as a water source, city water or circulating cooling water cooled to a predetermined temperature. A valve 41 and a valve 42 control supply amounts of the cooling water to the cooling water channel 25a and the cooling block 56 respectively in accordance with a command from the controller 36 based on the recipe. Normally, the water having a water pressure or a flow rate which are substantially constant is supplied to the supply system, the substantially constant cooling water is made to flow in the coolers by simply opening/closing the valves 41 and 42. The recipe may be defined such that the flow rate of the cooling water of the cooling block 56 is increased only when the exhaust pipe 32 is overheated during the series of the substrate processing.

Here, in a case of uniformly heating the inlet flange 5, the temperature in the vicinity of the gas exhaust port that receives the heat of the exhaust gas becomes higher than temperatures in the vicinity of the gas introduction ports 51a to 51c that supply the gas, and temperature unevenness is caused in a circumferential direction of the furnace throat of the tubular reactor 2. In other words, the tongue portion 57 is intended to protect the seal member 6 and not intended to completely remove influence of the heat of the exhaust gas, and the temperature unevenness of the inlet flange 5 cannot be eliminated only by the tongue portion.

Additionally, in a case where a temperature sensor is provided in each of the above-described heater elements 50a to 50f to perform temperature adjustment, a controlling structure becomes complicated. Furthermore, in this case, the number of temperature sensors must be increased more than in the present embodiment.

In the present embodiment, as shown in FIG. 4 described above, the heater 50 disposed on the outer peripheral surface of the inlet flange 5 is divided into the six heater elements 50a to 50f in a circumferential direction, and the heater elements 50a to 50f are divided into two groups. Additionally, the temperature controller 60 controls power supply to the heater elements 50a to 50f independently for each of the two groups based on detection temperatures detected by the temperature sensors 52a and 52b installed in the respective groups. As a result, necessary heating can be performed in a necessary place, the temperature unevenness in the circumferential direction of the furnace throat of the tubular reactor 2 can be reduced, and an area that is hardly heated can be actively heated.

Furthermore, heating the entire portion in the circumferential direction to an appropriate temperature can prevent adhesion of a by-product. Note that in a case of using, as the heater elements 50a to 50f, self-regulating heaters (auto trace heaters) in each of which an ohmic resistance (heat generation amount) is changed in accordance with a temperature, reduction of the temperature unevenness within each of the groups can also be expected.

Figure 7:
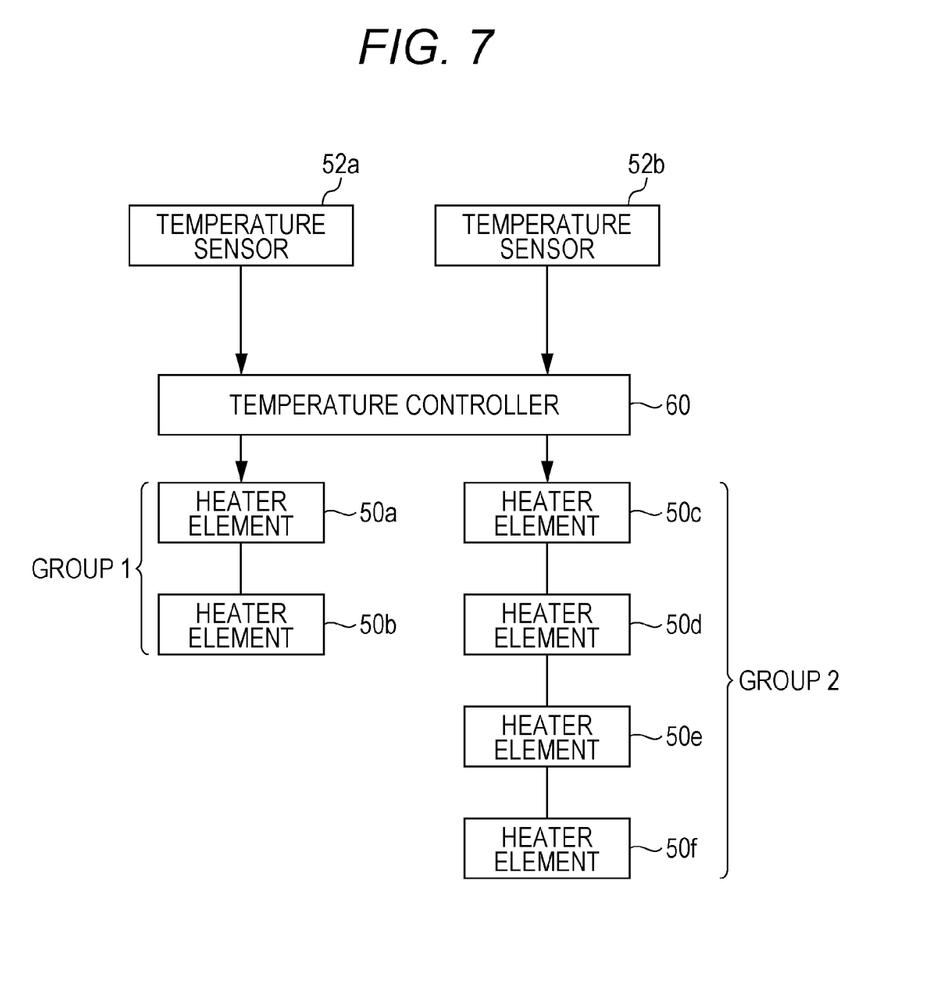
FIG. 7 is a block diagram to describe operation of a temperature controller.

Next, operation of the temperature controller 60 that controls each of the heater elements 50a to 50f in the present embodiment will be described based on FIG. 7.

The heater elements 50a to 50f are divided into the two groups of: a group 1 including the heater elements 50a and 50b in the vicinity of the exhaust pipe 32 where the temperature tends to be high; and a group 2 including the heater elements 50c, 50d, 50e and 50f other than the group 1.

The heater element 50a and the heater element 50b of the group 1 are electrically connected in series or in parallel such that a heat generation amount per unit length on the outer peripheral surface of the inlet flange 5 becomes equal. Additionally, the heater elements 50c to 50f of the group 2 are electrically connected in series or in parallel such that a heat generation amount per unit length becomes equal in a similar manner. Note that a length of the outer peripheral surface is not a length of the heater element 50a itself or the like but a length of the outer peripheral surface of the inlet flange 5 to be shared by the heater element 50a and the like, and an end of the length reaches a center of a gap between adjacent heater elements, for example. Furthermore, in a case of connecting the heater elements in parallel in each of the groups, a resistance value of each of the heater elements is made to be inversely proportional to the length.

The temperature controller 60 controls the power supply to the heater elements 50a and 50b of the group 1 (manipulated variable) based on the detection temperature detected by the temperature sensor 52a installed in an area of the group 1 (controlled variable). Additionally, the temperature controller 60 controls the power supply to the heater elements 50c to 50f of the group based on the detection temperature detected by the temperature sensor 52b installed in an area of the group 2. In other words, the temperature controller 60 performs feedback control for the power supply to each of the groups independently for each of the groups, where The independent control means existence of a manipulated variable and a controlled variable for respective groups and not means that each controls are unaffected during operation.

Specifically, the temperature controller 60 performs PID control such that the temperature detected by the temperature sensor 52a coincides with a first set temperature (target value) $T_{p1}$ to control the power supply to the heater elements 50a and 50b of the group 1. Furthermore, the temperature controller 60 performs the PID control such that the temperature detected by the temperature sensor 52b coincides with a second set temperature $T_{p2}$ to control the power supply to the heater elements 50c to 50f of the group 2.

In other words, the six heater elements disposed at the inlet flange 5 is divided into the two groups including the group in the vicinity of the exhaust port and the other group, and the feedback control for the power supply to the respective heater elements is performed independently for each of the groups based on the detection temperatures detected respectively by the two temperature sensors provided in the areas of the respective groups. Note that the temperature sensors 52a and 52b are to be located in the areas where the heater elements of the respective groups are arranged, and preferably, are provided in the vicinity of centers of the respective groups in a manner thermally coupled to the inlet flange 5.

Furthermore, the flow rate of the cooling water in the coolers or the like, such as the cooling water channel 25a and the cooling block 56, are included as disturbances. One of conventional problems is that a temperature difference (deviation) between the inside and the outside of the inlet flange 5 cannot be cancelled even when the temperature difference is varied by the disturbances because a temperature measured by the temperature sensor 52a or the temperature sensor 52b is not a temperature inside the inlet flange 5 to which a by-product adheres but a temperature outside the inlet flange 5. Here, the temperature controller 60 of the present embodiment further performs feedforward control for the power supply to the respective groups based on these disturbances. In other words, predetermined setting temperatures of the respective groups are compensated respectively based on an exhaust state from the exhaust pipe 32 or a cooling state of the cooling water channel 25a or the like, and the power supply to the respective heater elements is respectively controlled independently for each of the groups such that the detection temperatures by the respective temperature sensors 52a and 52b coincide with the compensated set temperatures. Specifically, the set temperature of the group 1 is lowered in accordance with the heating by the exhaust gas, or in a case where the flow rate of the cooling water is large, the set temperature is controlled so as not to be excessively lowered.

For example, in the present embodiment, the set temperature of the group 1 on the exhaust port side can be lowered in proportion to a water-cooling flow rate $F_{chn}$ by the cooling water channel 25a, a water-cooling flow rate $F_{blk}$ by the cooling block 56, or an estimated thermal dose from the exhaust gas. Alternatively, the set temperatures of the group 1 and the group 2 can be raised in proportion to the water-cooling flow rate. The thermal dose from the exhaust gas is estimated based on an exhaust gas temperature and an exhaust gas flow rate (molar amount) calculated from a processing temperature (a temperature of the area where the wafers W are arranged), and a molar amount and a reaction heat generation (endothermic) amount of the reaction gas supplied per unit time. The controller 36 calculates the above-described thermal dose or holds a compensation amount preliminarily obtained from calculation or measurement for a predetermined processing recipe, and sets the compensation amount for the temperature controller 60 at the time of processing. The temperature controller calculates the set compensation amount from a given thermal dose and the set temperature, or compensates the set temperature simply by using a given compensation amount.

For example, the temperature controller 60 can use the following as the first set temperature and the second set temperature each including the compensation amount:

$$T_{p1} = T_{prv} - a_1 \times T_{fun} + b_1 \times F_{chn},$$

$$T_{p2} = T_{prv} - a_2 \times T_{fun} + b_2 \times F_{blk} - c \times F_{exh} - d \times P_{exh},$$

where $T_{prv}$ represents an inner surface temperature of the inlet flange 5, at which adhesion of a by-product can be prevented, $T_{fun}$ represents a temperature (of a wafer W)

inside the process chamber 8, $F_{exh}$ and $P_{exh}$ represents the flow rate and pressure of the exhaust gas, and $a_1$, $a_2$, $b_1$, $b_2$, c and d represent positive constants of proportion.

Furthermore, in a case where any one of the temperature sensors is disconnected, switching is performed so as to control the power supply to the heater elements 50a to 50f by using the temperature sensor that is not disconnected.

Next, processing (deposition processing) to form a film on each wafer W by using the above-described substrate processing apparatus 1 will be described. Here, the description will be provided for a case where a silicon nitride (SiN) film is formed on the wafer W by supplying the wafer W with $SiH_2Cl_2$ (dichlorosilane (DCS)) as a source gas and an $NH_3$ (ammonia) gas as a reaction gas. Note that, in the following description, operation of the respective constituent elements constituting the substrate processing apparatus 1 is controlled by the controller 36.

When a plurality of wafers W is charged onto the boat 14 (wafer charge), the boat 14 is loaded (boat load) into the process chamber 8 by the boat elevator 17, and a portion from the lower portion of the tubular reactor 2 is brought into a state hermetically sealed by the lid 9. At this time, an $N_2$ gas is supplied as the first purge gas 28 from the first purge gas supplier to the bases of the nozzles 23a to 23c via the gap 46. Additionally, an $N_2$ gas is supplied as the second purge gas 49 from the second purge gas supplier to the gap 46 via the second purge gas flow path 27. Furthermore, a third purge gas 29 branched from the first purge gas 28 is supplied into the inner peripheral surface of a cylindrical body 39. The supply from each of the first purge gas 28 and the second purge gas 49 is continued at least until the deposition processing is completed. Additionally, in a case where the valves are not opened, the valves 41 and 42 are opened before the lid 9 abuts on the inlet flange 5.

The inside of the process chamber 8 is subjected to vacuum exhaust (pressurization and gas exhausting) by the vacuum pump 35 so as to obtain a predetermined pressure (vacuum degree). The pressure inside the process chamber 8 is measured by the pressure sensor 33, and the APC valve 34 is subjected to the feedback control based on measured pressure information. Additionally, the wafers W inside the process chamber 8 are heated by the heater 3 so as to maintain a predetermined processing temperature such as 500° C. or higher. At this point, an energization state to the heater 3 is subjected to the feedback control based on temperature information detected by the temperature detector 4 such that the process chamber 8 obtains a predetermined temperature distribution. Additionally, rotation of the boat 14 and the wafers W by the rotation mechanism 16 is started.

Also at this time, the inlet flange 5 is heated to, for example, a set temperature of 270° C. by the respective heater elements 50a to 50f. At this point, an energization state to the heater elements 50a to 50f of the respective groups is subjected to the feedback control by the temperature controller 60 such that the heater elements arranged in the respective areas of the inlet flange 5 obtain the set temperature. The set temperature may be set, for example, such that a partial pressure of a by-product does not exceed a saturation vapor pressure at the set temperature, and more preferably, the partial pressure becomes lower than the saturation vapor pressure by a predetermined amount. The number of by-products is not limited to one, and may include ammonium chloride, chlorosilane polymer, and the like. Note that the heating to the heater elements 50a to 50f is continued at least until the deposition processing is completed.

When the temperature inside the process chamber 8 is stabilized to the preset processing temperature, the DCS gas is supplied to the wafers W inside the process chamber 8. The DCS gas is controlled by the MFC 21a to obtain a desired flow rate and is supplied into the process chamber 8 via the gas supply pipe 19a and the nozzle 23a. At this time, the $N_2$ gas is supplied to the furnace throat from the first purge gas supplier and the second purge gas supplier. Consequently, the bases and the peripheral portions of the nozzles 23a to 23c can be intensively purged with the first purge gas 28, and other portions thereof can be purged with the second purge gas 49, and a concentration of the source gas at the furnace throat can be diluted. Note that, in this process, the supply of $N_2$ gas from the first purge gas supplier and the second purge gas supplier may be temporarily increased.

Next, the supply of the DCS gas is stopped, and the inside of the process chamber 8 is subjected to the vacuum exhaust by the vacuum pump 35. At this time, the $N_2$ gas may be supplied as an inert gas into the process chamber 8 from the inert gas supplier (inert gas purge). In this gas exhaust process, the APC valve 34 is temporarily full-opened, and the exhaust gas having a large flow rate and a high temperature may flow through the exhaust port 26. During this time, the controller 36 can control the valve 42 such that the cooling water is sufficiently supplied to the cooling block 56, and further can provide the temperature controller 60 with a compensation value so as to lower the set temperature.

Next, the $NH_3$ gas is supplied to the wafers W inside the process chamber 8. The $NH_3$ gas is controlled by the MFC 21b so as to obtain a desired flow rate, and is supplied into the process chamber 8 via the gas supply pipe 19b and the nozzle 23b. At this time, the $N_2$ gas is supplied to the furnace throat from the first purge gas supplier and the second purge gas supplier. Consequently, the bases and the peripheral areas of the nozzles 23a to 23c can be purged intensively, and other portions can be purged, and the concentration of the reaction gas at the furnace throat can be diluted.

Next, the supply of the $NH_3$ gas is stopped, and the inside of the process chamber 8 is subjected to the vacuum exhaust by the vacuum pump 35. At this time, the $N_2$ gas may be supplied into the process chamber 8 from the inert gas supplier (inert gas purge). Additionally, the cooling water and the set temperature may be controlled in a manner similar to the source gas exhaust process.

A SiN film having a predetermined composition and a predetermined film thickness can be formed on each wafer W by performing a cycle including the above-described four processes the predetermined number of times (once or more).

After the film having the predetermined film thickness is formed, the $N_2$ gas is supplied from the inert gas supplier to replace the inside of the process chamber 8 with the $N_2$ gas and also restore the pressure of the process chamber 8 to an atmospheric pressure. After that, the lid 9 is moved down by the boat elevator 17, and the boat 14 is unloaded from the tubular reactor 2 (boat unload). Then, the processed wafers W is discharged from the boat 14 (wafer discharge). The Heater 3 could sustain the temperature inside the tubular reactor 2 higher than 500° C. so as to shorten waiting times of cooling and recovering the temperature for the next batch process. In this situation, a lot of heat is transferred to the exhaust port 26 from the gas inside at high pressure and high temperature.

As processing conditions at the time of forming the SiN film on each wafer W, following conditions are exemplified.

Processing temperature (wafer temperature): 300° C. to 800° C.

Processing pressure (pressure inside process chamber): 1 Pa to 4000 Pa

DCS gas: 100 sccm to 10000 sccm $NH_3$ gas: 100 sccm to 10000 sccm, $N_2$ gas: 100 sccm to 10000 sccm, The deposition processing can be appropriately proceeded by setting the respective processing conditions to values within the above respective ranges. Note that the deposition processing is not limited to the formation of the SiN film on each wafer W, and can be suitably applied to a case of forming, for example, a $SiO_2$ film, a SiON film, or the like on the wafer W.

In the above, an embodiment of the present disclosure has been specifically described. However, the present disclosure is not limited to the above-described embodiment, and various modifications can be made without departing from the gist thereof.

Figure 8:
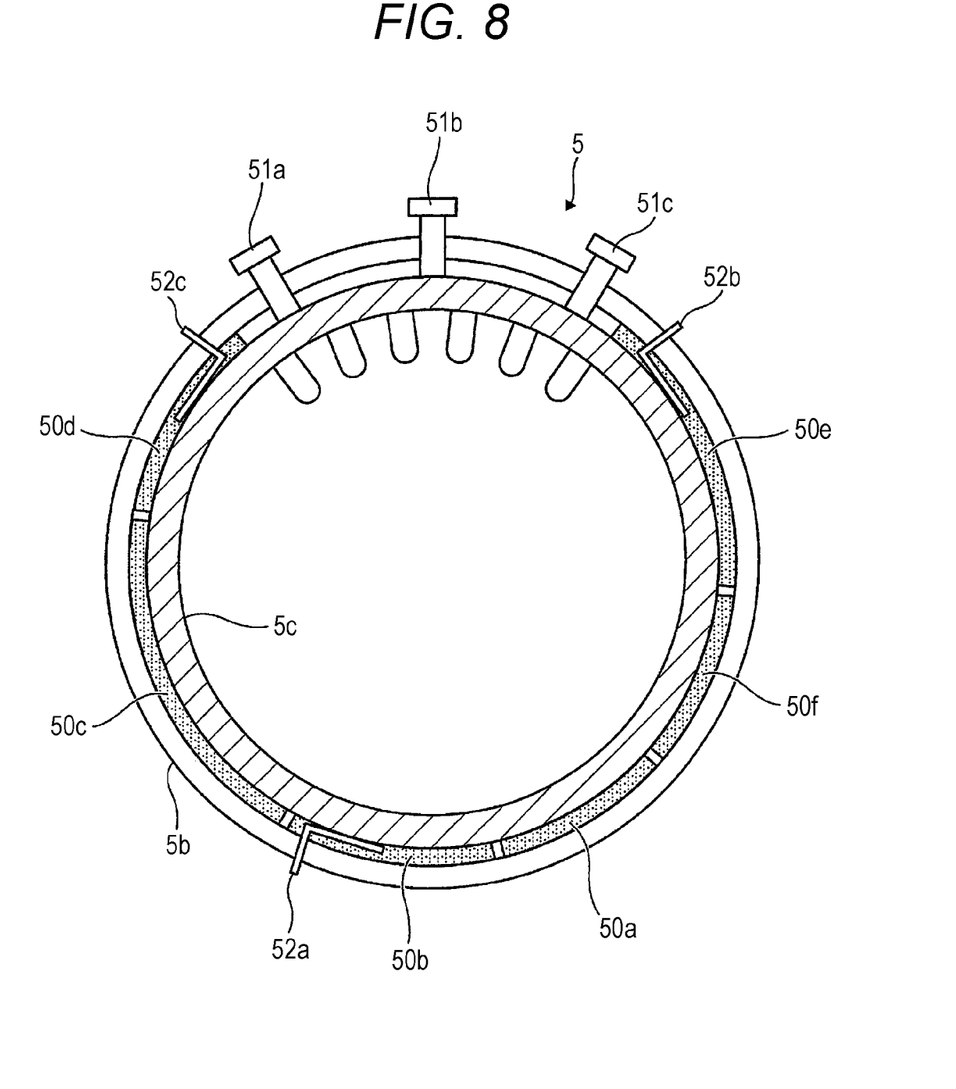
FIG. 8 is a view showing a modified example of the inlet flange.

For example, in the embodiment described above, six heater elements are divided into two groups, and power supply to each of the heater elements is controlled independently for each of the groups, but the present disclosure is not limited thereto. The present disclosure is also applicable to a case where the six heater elements are divided into two or more groups such as three groups, and the power supply to the respective heater elements is controlled independently for each of the groups. Specifically, as shown in FIG. 8, temperature sensors 52a, 52b, and 52c are disposed in respective areas of the three groups of: a group 1 including heater elements 50a and 50b in the vicinity of an exhaust pipe 32 where a temperature tends to be high; a group 2 including heater elements 50c and 50d; and a group 3 of heater elements 50e and 50f, in which the groups 2 and 3 are obtained by dividing the heater elements 50c, 50d, 50e, and 50f excluding the heater elements of the group 1. Then, the power supply to the heater elements of the respective groups may be controlled based on detection temperatures detected by three temperature sensors.

In other words, the heating elements can be controlled by being divided into a plurality of groups depending on a cause of temperature unevenness, such as an uneven (asymmetrical) flow of an exhaust gas, thermal escape from piping components or the like provided in an inlet flange 5, or clogging at a cooling water channel 25a or a cooling block 56. In this case, even in a case where a part of the temperature sensors or the heater elements is disconnected or becomes out of work, the control can be performed by using another temperature sensor or another heater element.

Figure 9:
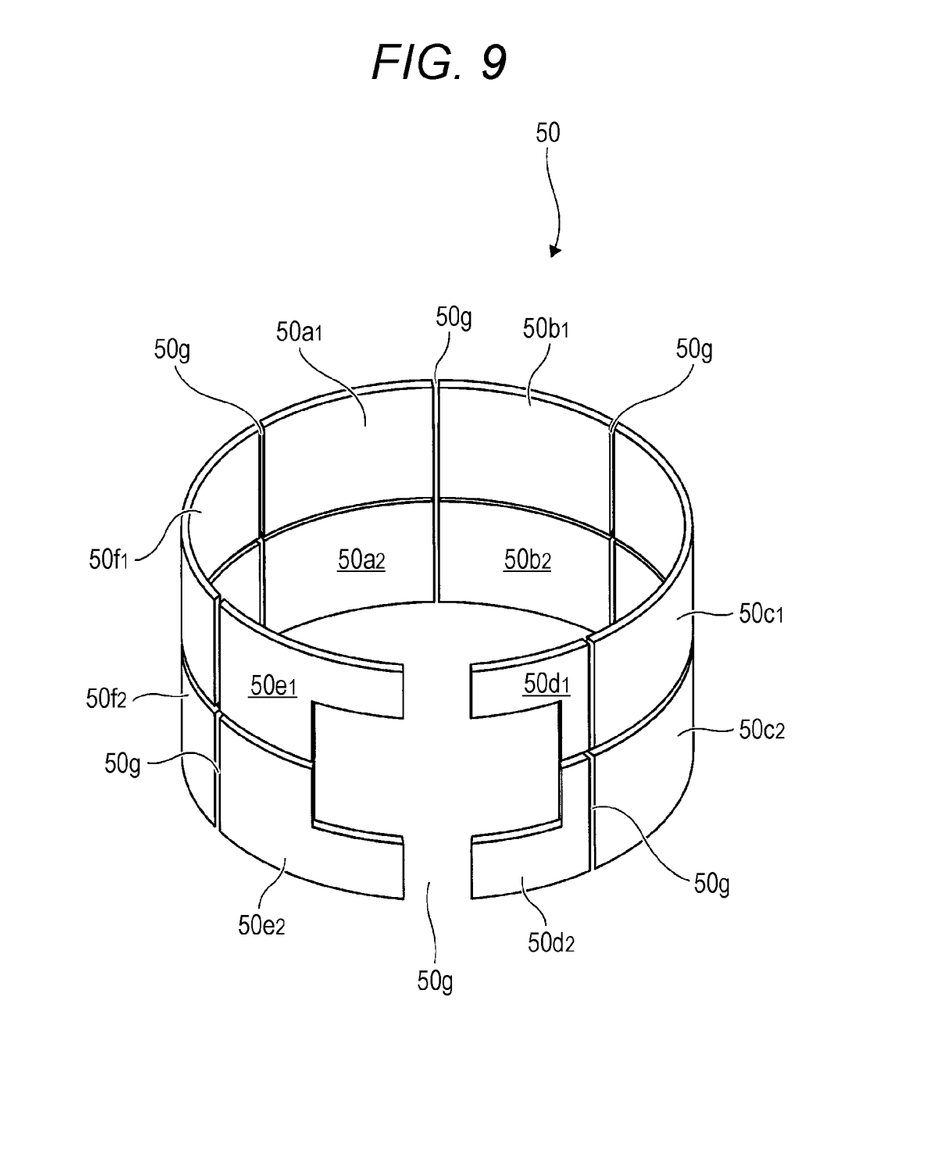
FIG. 9 is a view showing a modified example of the heater elements.

Furthermore, as shown in FIG. 9, a heater 50 may be divided not only in a circumferential direction but also in a height direction. Since the plurality of heater elements is independently controlled, an inner peripheral surface of the inlet flange 5 can be heated uniformly in the height direction or so as to obtain a desired temperature distribution.

Additionally, the heater 50 may also be divided in a radial direction. For example, a double structure may be used, in which the double structure includes: an inner-side heater element provided in a manner closely contacting an outer peripheral surface of the inlet flange 5; and an outer-side heater element provided on an outer side of the inner-side heater element via a heat insulation layer. The outer-side heater element reduces a temperature gradient inside the heat insulation layer and reduces a heat amount dissipated through the heat insulation layer. Since a heat generation amount required in the inner-side heater element is small, a cost may be inexpensive.

The heater 50 is not limited to the one that heats the inner peripheral surface of the inlet flange 5 to have a uniform temperature. For example, a set temperature may be determined such that a partial pressure of a by-product on the inner peripheral surface of the inlet flange 5 corresponding to each group does not exceed a saturation vapor pressure. In other words, since the partial pressure of the by-product may be changed depending on a distance from an opening portion 2E or flow rates of a first purge gas 28 and a second purge gas 49, the set temperature may be set such that a position having a high partial pressure also has a high temperature.

Furthermore, control of a compensation value and an amount of cooling water is not limited to be performed during substrate processing such as deposition, and may be suitably performed at the time of gas screening inside a tubular reactor 2 as well. A set temperature at this time may be uniformly given such that etching reaction occurs uniformly. Alternatively, the set temperature may be set at a high temperature at a position where a thickness of deposits to be removed is large.

In the above embodiment an example in which a controller 36 uses a compensation amount preliminarily obtained has been described, however, in a case that only one compensation amount is determinant of adhesion of by-products in a recipe, temperature unevenness may be suppressed also by giving the heater 50 with variance in a unit heat generation amount along the circumference that corresponds to the compensation amount. In other words, the heater 50 is to have a heat generation amount distribution such that a heat generation amount at an exhaust port 26 becomes lower than in other portions. A self-regulating heater can be used for this purpose.

According to the present disclosure, temperature unevenness in the furnace throat can be reduced, and adhesion of a by-product to the furnace throat can be suppressed.

What is claimed is:

1. A substrate processing apparatus comprising:
a substrate holder that holds a plurality of substrates arrayed at predetermined intervals;
a tubular reactor that has a cylindrical shape that extends in a vertical direction, the tubular reactor including a ceiling at an upper end and an opening portion at a lower end, and housing the substrate holder in a manner such that the substrate holder can be carried in and out through the opening portion, and;
a cylindrical inlet flange hermetically connected to the opening portion of the tubular reactor and including a plurality of gas introduction ports on an outer peripheral surface;
a lid that closes a lower end opening of the inlet flange in a manner such that the substrate holder can be carried in and out;
temperature sensors thermally coupled to the inlet flange or heater elements installed on the inlet flange and configured to detect temperatures, the heater elements divided in circumferential direction and disposed along the inlet flange while avoiding the gas introduction ports; and
a temperature controller configured to divide the heater elements into groups of N, where N is a number of sensors more than 1 and less than a number of the heater elements, and control power supplied to the respective groups of heater elements independently based on detection temperatures detected by the corresponding temperature sensors;

wherein the inlet flange includes an upper flange hermetically connected to the opening portion of the tubular reactor at an upper end and fixed by a clamp, a lower flange hermetically connected to the lid at a lower end, and a cylindrical portion connecting the upper flange and the lower flange, the inlet flange or the clamp includes an embedded cooling water channel, wherein the temperature controller performs a feed-forward control for the power supply to at least one of the groups based on an exhaust state of the tubular reactor and a cooling state of the cooling water channel.

2. The substrate processing apparatus according to claim 1, wherein the tubular reactor includes, in a vicinity of the opening portion, an exhaust pipe configured to exhaust an internal gas and receive heat from the internal gas while exhausting;

wherein the heater elements are divided at least into a first group that includes a first heater element and a second group that includes a second heater element arranged farther from the exhaust pipe than the first heater element;

wherein the temperature controller applies different compensation values to the first group and second group depending on the exhaust state from the exhaust pipe and the cooling state.

3. The substrate processing apparatus according to claim 2, wherein the upper flange or the clamp includes the cooling water channel embedded piecewise in an entire periphery, and a height of the cylindrical portion is set substantially equal to or less than a maximum diameter of connectors included in the plurality of gas introduction ports, and the heater elements are connected electrically in series or in parallel in each of the groups, and have an equal heat generation amount per unit length.

4. The substrate processing apparatus according to claim 2, further comprising a cooler provided adjacent to at least a lower side of the exhaust pipe and configured to cool the exhaust pipe;

wherein the temperature controller compensates a deviation between a temperature measured by one of the temperature sensors and the temperature at the inside of the inlet flange while the deviation is varied by the disturbances caused by receiving heat from the internal gas and cooling by the cooler.

5. The substrate processing apparatus according to claim 2, wherein the temperature controller is configured to:

control power supply to the heater elements such that the detection temperatures by the N pieces of the temperature sensors coincide with a determined set temperature, and store or calculate the compensation values that modify the set temperature for the first group and the second group.

6. The substrate processing apparatus according to claim 5, wherein the set temperature for each of the groups is determined such that the higher a partial pressure of a by-product on the inner peripheral surface becomes, the higher the set temperature is set.

7. The substrate processing apparatus according to claim 5, the set temperature for each of the groups is determined such that the thicker deposits to be removed become, the higher the set temperature is set.

8. The substrate processing apparatus according to claim 2, wherein the temperature controller is configured to control power supply to the heater elements such that the detection temperatures by the N pieces of the temperature sensors coincide with a set temperature compensated by the compensation values, the compensation value for the first group decrease the set temperature in proportion to an estimated thermal dose from the exhaust gas to the exhaust pipe and the compensation value for the second group increase the set temperature in proportion to an flow rate in the cooling water channel.

9. The substrate processing apparatus according to claim 1, further comprising struts that press the heater elements against the outer peripheral surface of the inlet flange.

10. The substrate processing apparatus according to claim 9, wherein each of the heater elements is pressed by two to three struts via an adiabatic pressure plate.

11. The substrate processing apparatus according to claim 1, wherein at least one of the heater elements includes an auto trace heater that changes ohmic resistance thereof in accordance with a temperature.

12. The substrate processing apparatus according to claim 1, wherein the tubular reactor includes:

in a vicinity of the opening portion, an exhaust port configured to exhaust an internal gas and receive heat from the internal gas while exhausting;

an overlaid portion formed around a connection between the tubular reactor and the exhaust pipe, a lower end of the overlaid portion is located closer to a lower end to an extent connected to a lower end flange of the tubular reactor.

13. The substrate processing apparatus according to claim 12, further comprising:

a cooling block provided in the vicinity of the exhaust port and a cooling water can circulate in the cooling block; and a tongue portion that is made from metal, extends from the cooling block and enters the cut-away portion of the overlaid portion.

14. The substrate processing apparatus according to claim 1, wherein at least one of the heater elements includes an inner-side heater element contacting an outer peripheral surface of the inlet flange and an outer-side heater element provided on an outer side of the inner-side heater element via a heat insulation layer.

* * * * *